(12) United States Patent
    Yamazaki et al.

(10) Patent No.: US 6,986,937 B2
(45) Date of Patent: *__Jan. 17, 2006__

(54) DOUBLE-SIDED COPPER-CLAD LAMINATE FOR FORMING CAPACITOR LAYER AND METHOD FOR MANUFACTURE THEREOF, AND PRINTED WIRING BOARD OBTAINED USING THE DOUBLE-SIDED COPPER-CLAD LAMINATE FOR FORMING CAPACITOR LAYER

(75) Inventors: Kazuhiro Yamazaki, Ageo (JP); Takashi Syoujiguchi, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/778,215

(22) Filed: Feb. 17, 2004

(65) Prior Publication Data

US 2004/0161593 A1     Aug. 19, 2004

(30) Foreign Application Priority Data

Feb. 18, 2003   (JP)   ............................. P2003-039600

(51) Int. Cl.
    *B32B 9/00*     (2006.01)
    *H01G 4/08*    (2006.01)
(52) U.S. Cl. ...................... 428/209; 428/612; 428/901; 205/50; 361/323
(58) Field of Classification Search ................ 428/209, 428/546, 612, 901; 361/323, 301.4; 205/50
See application file for complete search history.

(56) References Cited

U.S. PATENT DOCUMENTS

| | | | | |
|---|---|---|---|---|
| 4,997,516 A | * | 3/1991 | Adler | 216/101 |
| 5,155,655 A | * | 10/1992 | Howard et al. | 361/303 |
| 5,437,914 A | * | 8/1995 | Saida et al. | 428/209 |
| 5,679,230 A | * | 10/1997 | Fatcheric et al. | 205/50 |
| 6,693,793 B2 | * | 2/2004 | Kuwako et al. | 361/323 |

FOREIGN PATENT DOCUMENTS

| | | |
|---|---|---|
| JP | 2001-339167 | 12/2001 |
| JP | 2002-009416 A | 1/2002 |

* cited by examiner

*Primary Examiner*—Cathy F. Lam
(74) *Attorney, Agent, or Firm*—Rothwell, Figg, Ernst & Manbeck, P.C.

(57) ABSTRACT

The present invention relates to a double-sided copper-clad laminate for forming a capacitor layer, formed by adhering electrodeposited copper foils on the both sides of a dielectric layer of a thickness of 10 μm or less, and the object of the present invention is to secure good voltage resistant proprieties.

For the double-sided copper-clad laminate of the present invention uses an electrodeposited copper foil provided with a matte side to be joined to the dielectric layer prepared by physically polishing the rough surface of an untreated electrodeposited copper foil obtained by an electrolysis method to a surface roughness (Rz) of 0.5 μm to 3.0 μm, and nodular treatment, and as required, passivation, silane coupling agent treatment, or the like are performed thereon. As the manufacturing method thereof, a manufacturing method wherein the surfaces of the resin layers of two electrodeposited copper foils having resin layers facing to each other are adhered, or the like.

8 Claims, 9 Drawing Sheets

(a)

(b)

(c)

(d)

(a)

(b)

DOUBLE-SIDED COPPER-CLAD LAMINATE FOR FORMING CAPACITOR LAYER AND METHOD FOR MANUFACTURE THEREOF, AND PRINTED WIRING BOARD OBTAINED USING THE DOUBLE-SIDED COPPER-CLAD LAMINATE FOR FORMING CAPACITOR LAYER

BACKGROUND OF THE INVENTION

1. Field of the Invention

The present invention relates to a double-sided copper-clad laminate for forming a capacitor layer and a method for the manufacture thereof, and a printed wiring board obtained using the double-sided copper-clad laminate for forming a capacitor layer.

2. Description of the Related Art

In recent years, the clock frequency of computers has reached a GHz level, and the circuit design of central processing units (CPUs), the performance of IC chips, and the like has become important. The circuit design of printed wiring boards used for mounting these has also become very important. In order to cope with the above-described increased signal transmission speed, the manufacturers of printed wiring boards have made various devices such as increase in the number of layers of a printed wiring board from the aspect of structures, and the shortening of signal transmission distance by changing circuit design from the aspect of circuit arrangement.

A capacitor formed on a printed wiring board plays the role of stably supplying the operating power of the device, and has generally disposed on the outer layer of the printed wiring board. However, a method for forming a capacitor on the inner layer of a multi-layer printed wiring board using a double-sided copper-clad laminate or the like has become widely used for the reason that it can be easily thinned, and excellent properties can be achieved. In order to such a capacitor layer, a thin double-sided copper-clad laminate has been used.

The double-sided copper-clad laminate used for forming the capacitor layer normally uses an FR-4 base material produced from an epoxy-resin-impregnated glass cloth an insulator (=dielectric layer), and copper foils are adhered on the both sides thereof At this time, the FR-4 base material as thin as possible has been used to secure a high electric capacity. Capacitor circuit patterns have been formed on the both sides of the double-sided copper-clad laminate of such a structure, and have been used as a material for forming a built-in capacitor layer of the multi-layer copper-clad laminate. In order to obtain a high electric capacity as a capacitor circuit, the manufacture of a double-sided copper-clad laminate having further thin dielectric layer has been attempted (Patent Document 1: Japanese Patent Laid-Open No. 2002-9416; Patent Document 2: Japanese Patent Laid-Open No. 2001-339167).

However, an electrodeposited copper foil is generally used as the copper foil composing a thin double-sided copper-clad laminate for forming the capacitor layer, and in addition, nodular treatment to make the surface irregular for obtaining the anchor effect to improve adhesion between the electrodeposited copper foil and the dielectric layer is performed on the joining interface of the electrodeposited copper foil to the dielectric layer.

Therefore, as the thickness of the dielectric layer of the double-sided copper-clad laminate becomes thinner, the nodular-treated surfaces approach to each other, and if there is an abnormally grown nodular-treated area, or an abnormally raised portion is produced on the copper foil before nodular treatment, the copper foil surfaces are partially short-circuited to each other, and when a voltage is impressed between the copper foil surfaces, conduction occurs between facing copper foils, causing a serious problem in thinning the dielectric layer, and significantly lowering the product yield to 40% or below.

As a result, the production costs of the double-sided copper-clad laminate having a thin dielectric layer have inevitably increased, and the supply of inexpensive and high-quality products have become difficult.

SUMMARY OF THE INVENTION

Therefore, the present inventors repeated studies for solving the above-described problems, and devised the invention described below.

<Double-sided Copper-clad Laminate for Forming Capacitor Layer>

A claim describes as "a double-sided copper-clad laminate for forming a capacitor layer formed by adhering electrodeposited copper foils on the both sides of a dielectric layer, wherein the electrodeposited copper foil is provided with a matte side to be joined to the dielectric layer prepared by physically polishing the rough surface of an untreated electrodeposited copper foil obtained by an electrolysis method to a surface roughness (Rz) of 0.5 $\mu$m to 3.0 $\mu$m, and nodular treatment, and as required, passivation, silane coupling agent treatment, or the like are performed thereon" (hereafter referred to as 'first double-sided copper-clad laminate').

Another claim describes as "a double-sided copper-clad laminate for forming a capacitor layer formed by adhering electrodeposited copper foils on the both sides of a dielectric layer, wherein said electrodeposited copper foil is provided with a shiny side to be joined to the dielectric layer adjusted by physically polishing the rough surface of an untreated electrodeposited copper foil obtained by an electrolysis method to a surface roughness (Rz) of 0.5 $\mu$m to 3.0 $\mu$m, and nodular treatment, and as required, passivation, silane coupling agent treatment, or the like are performed on the surface thereof" (hereafter referred to as 'second double-sided copper-clad laminate').

Both the first and second double-sided copper-clad laminates have three-layer structures of electrodeposited copper foil layer/dielectric layer/electrodeposited copper foil layer, and even if the thickness of the dielectric layer is 10 $\mu$m or less, the production yield of double-sided copper-clad laminates for forming capacitor layers can be improved to 70% or more, because the probability of short-circuiting between the electrodeposited copper foils on the both sides decreases dramatically when the breakdown voltage is measured.

A conventional double-sided copper-clad laminate for forming a capacitor layer has also been manufactured by hot-press forming so that a dielectric layer 2 is located between electrodeposited copper foil layers CF as FIG. 9 shows. If the dielectric layer 2 is thinned and a voltage is impressed between the electrodeposited copper foil layers CF, the abnormally grown end portion of the nodular treatment, very schematically shown as point A in FIG. 9, contacts or approaches to the surface of the facing electrodeposited copper foil (point B), causing short-circuiting or discharging (hereafter briefly referred to as "conduction phenomenon").

Such nodular treatment is generally known to be a treatment wherein copper microparticles are formed and adhered on the surface of an untreated electrodeposited copper foil under burn plating conditions, and the prevention of the copper microparticles from dropping off as required. Therefore, it is considered that if an abnormal-shaped area is present on the surface of the untreated electrodeposited copper foil, the electrolytic current of copper burn plating for adhering copper microparticles as the nodular treatment is concentrated to this area, causing the abnormal adhesion of copper microparticles, and producing abnormally deposited portions protruded on the nodular surface.

This way of thinking leads to the idea to remove the abnormal-shaped area from the surface to be subjected to the nodular treatment of an untreated electrodeposited copper foil. Here, for the ease of description, what is called an "untreated electrodeposited copper foil" will be described. An untreated electrodeposited copper foil is a pure copper foil produced by flowing a copper electrolyte, such as a copper sulfate solution, between a drum-shaped rotating cathode and an anode or the like facing along the shape of the rotating cathode to allow copper to deposit on the surface of the rotating cathode employing an electrolytic reaction; and the deposited copper is continuously peeled off the rotating cathode as a foil. The untreated electrodeposited copper is in the state where no surface treatments, such as passivation, have been performed, copper immediately after electrocrystallization is in an activated state, and is very likely to be oxidized by oxygen in the air. An untreated electrodeposited copper foil after subjected to surface treatments, such as nodular treatment and passivation, is herein referred to as an "electrodeposited copper foil".

The surface of the untreated electrodeposited copper foil peeled off the state contacting the rotating cathode has the shape transferred from the surface shape of the mirror-polished rotating cathode, and since it is a shiny and smooth surface, it is referred to as a shiny side. Whereas, the surface of the deposition side of the untreated electrodeposited copper foil has an irregular shape with conical protrusions because each crystal face of deposited copper has different crystal growth speed, and is referred to as a matte side. The matte side is generally used as the adhering surface to adhere copper microparticles in the nodular treatment. However, there may be a case where the shiny side is used as the adhering surface to adhere copper microparticles in the nodular treatment. Therefore, the terms "shiny side" and "matte side" are herein used for describing the surface of an untreated electrodeposited copper foil, and the term "nodular surface" is used for describing the surface after nodular treatment.

As described above, the matte side of an untreated electrodeposited copper foil has unavoidable variations in shape in a certain percentage caused of the method for manufacturing the untreated electrodeposited copper foil. Since the shiny side of an untreated electrodeposited copper foil is the replica of the surface shape of the rotating cathode, if the surface of the rotating cathode is roughened, or has fine scratches from the beginning, abnormal protrusions may be formed on the surface of the shiny side of the untreated electrodeposited copper foil. Normally, even if such an abnormal deposition occurs, no practical problems are caused in applications to normal printed wiring boards. However, in the present situation wherein the dielectric layer present between copper foils contains no skeleton materials, and the thickness of the dielectric layer is required to be 10 $\mu$m or less, the small shape abnormality, which did not cause problems conventionally, may cause problems in securing stable breakdown voltage and stable electrical capacity a capacitor.

First, in the "first double-sided copper-clad laminate", electrodeposited copper foils prepared from an untreated electrodeposited copper foil whose matte side is physically polished to form a smooth surface, which is subjected to nodular treatment, and passivation and the like as required (referred to as "first electrodeposited copper foil" for the ease of description) is used of forming the upper and lower electrodes when a capacitor circuit is formed. In other words, the untreated electrodeposited copper foil that composes the first electrodeposited copper foil used here requires physical polishing of the matte side thereof.

As described above, if the object is only "the removal of abnormal-shaped area on the surface to be subjected to the nodular treatment of the untreated electrodeposited copper foil", chemical polishing using solutions, or electrolytic polishing by the electrolysis of the surface in an electrolyte can also be used. However, in chemical polishing, since the entire polished surface becomes extremely smooth, and if copper microparticles are to be deposited using burn plating on the surface, the deposition site of the copper microparticles viewed structurally, and easily causes uneven deposition. On the contrary, if physical polishing is adopted to remove projections on the surface as in the present invention, a controlled surface having optimally fine irregularities on the smooth surface after polishing can be evenly formed, and when copper microparticles are adhered on the surface under burn-plating conditions, the fine irregularities on the smooth surface become the current-concentrating locations, i.e., the depositing sites of copper microparticles, and even deposition on a surface occurs easily. As a result, the uniformity of the surface after nodular treatment is dramatically improved.

The term "optimally fine irregularities" used herein is irregularities of the matte side of an untreated foil having a surface roughness (Rz) of 0.5 $\mu$m to 3.0 $\mu$m. The surface roughness used herein is so-called "10-point-average roughness measured in accordance with JIS B 06012. If the surface roughness (Rz) is less than 0.5 $\mu$m, the surface becomes difficult to evenly deposit copper microparticles. On the other hand, if the surface roughness (Rz) exceeds 3.0 $\mu$m, the final roughness of the nodular surface increases, and the production yield of the double-sided copper-clad laminate for a capacitor layer having a thickness of 10 $\mu$m or below, which is the object of the present invention lowers significantly.

The above-described surface roughness is of an untreated electrodeposited copper foil, and is not of an electrodeposited copper foil after surface treatment, such as nodular treatment and passivation. This means that if abnormal shapes are removed from the surface of the untreated foil, and the surface roughness is adjusted within an optional range, the current techniques of nodular treatment and the like can form nodular-treated surface without abnormal deposition, and a nodular-treated surface can be formed without abnormal deposition. The surface roughness (Rz) of the matte side of the above-described untreated electrodeposited copper foil was 0.5 $\mu$m to 3.0 $\mu$m. Thereafter, nodular treatment is performed to form a nodular-treated surface having a preferable surface roughness (Rz) of 1.0 $\mu$m to 3.5 $\mu$m. If the surface roughness (Rz) of the nodular-treated surface is less than 1.0 $\mu$m, sufficient adhesion to the dielectric layer cannot be obtained, and the nodular-treated surface is easily peeled off due to thermal shock. On the other hand, if nodular treatment is performed so that the surface roughness (Rz) exceed 3.5 $\mu$m, copper microparticles are excessively deposited, and the copper microparticles drop off easily, and residues after etching (etching residues) are easily produced.

Furthermore, although the nodular treatment, passivation as required, and silane coupling agent treatment must be described, these will be described in detail below in "a method for manufacturing a double-sided copper-clad laminate for forming a capacitor layer" according to the present invention.

Here, the dielectric layer will be described. In the present invention, the material of the dielectric layer is not specifically limited. Any material can be used as long as the material can constitute the dielectric layer as a capacitor, and whether a dielectric filler is contained or not is not also specifically limited. Above all, the material for constituting the dielectric layer is preferably an epoxy resin and the like considering that copper foils are adhered on the both sides. A method for manufacturing a normal copper-clad laminate can be used, and considering compatibility with nodular treatment carried out on the surface of the copper foil from the history of copper-foil development, excellent compatibility especially with epoxy-based resins is against the background. Therefore, in order to use an epoxy-based resin, the composition is not necessarily limited, but the composition can be adjusted accordingly based on the security of stable adhesion at the adhesion interface with the copper foil. Although the term "epoxy-based resin" used herein is a resin containing an epoxy resin as a component, it is not necessarily limited to the case where the epoxy resin is the major component, but is the resin that allows epoxy groups to involve in curing, and excels in the adhesion with copper foils. As the thermosetting resin, it is desirable to adopt a resin having a higher specific inductive capacity in order to obtain a higher capacitance. The specific inductive capacity used herein is a value measured using an Impedance Material Analyzer HP4291A under the condition of 1 MHz in accordance with Paragraphs 2.5.5.9 of IPC-TM-650, which is a testing manual of the IPC Standards.

Furthermore, the resin composing the dielectric layer may contain a filler as required. By thus making the resin contain a filler, the specific inductive capacity of the heat resistant film layer is increased, and the electrical capacity of the capacitor can be increased. For this filler, fine powder of a ferroelectric substance is used. Therefore, fine powder of a ferroelectric substance having a higher specific inductive capacity than the specific inductive capacity of the thermosetting resin should be adopted. Since materials such as a barium-titanate-based ceramic, a lead-titanate-based ceramic, a calcium-titanate-based ceramic, magnesium-titanate-based ceramic, a bismuth-titanate-based ceramic, a strontium-titanate-based ceramic, and a lead-zirconate-based ceramic have specific inductive capacities 10 times or more than the specific inductive capacity of the material constituting the thermosetting resin, if the resin contains these ceramics, the electrical capacity of a capacitor circuit formed thereafter can be significantly improved.

In some cases, a heat-resistant film can be contained in the dielectric layer. For example, the dielectric layer having a thermosetting resin/heat-resistant film layer/thermosetting resin composition may be considered. If the capacitor circuit if formed by etching, the dielectric layer is exposed on the area where the circuit is not present, and the exposed dielectric layer is protected from breaking due to the pressure of etching solution shower or washing water shower.

The showering pressure of the etching solution measured at the strainer portion is normally 10 to 15 kg/cm$^2$, and the ejecting pressure from the nozzle is also considerably high. If the entire dielectric layer is made of a hard and brittle material, and the dielectric layer is extremely thin, the dielectric layer will be broken by the pressure of the etching solution. Therefore, a material having both strength and a certain toughness is adopted for the heat-resistant film layer of the intermediate layer to prevent the breakdown of the layer, even if the epoxy resin layer constituting the thermosetting resin layer is hard and brittle.

Thus, the kind of the resin material constituting the heat-resistant film is quite important. It is preferable to constitute the heat-resistant film layer using a resin selected from a group consisting of polyethylene terephthalate, polyethylene naphthalate, polyvinyl carbazole, polyphenylene sulfide, polyamides, aromatic polyamides, polyamideimides, polyethersulfone, polyethernitrile, and polyether etherketone. These resins have generally higher softening points than the softening points of epoxy-based resins, are not degraded by pressing for processing to a copper-clad laminate, excel in insulation properties required as the basic properties of dielectrics, and have specific inductive capacities of as high as 2.5 or more. More strictly, the forming temperature of epoxy-based resins can be optionally designed by changing the modifying conditions thereof. Therefore, the forming temperature can be adjusted to be lower than the softening temperature of the heat-resistant film by changing the design of the epoxy-based resin depending on the material of the above-described heat-resistant film.

When the heat-resistant film made of the above-described material, the thickness thereof is preferably 0.5 $\mu$m or more. In other words, when the prevention of the breakdown of the resin layer due to showering of the etching solution is considered, thickness of at least 0.5 $\mu$m is required.

Even if the thickness of the above-described dielectric layer is as thin as 3.0 to 10.0 $\mu$m, the breakdown voltage quality of the double-sided copper-clad laminate for forming a capacitor layer of the present invention can be well maintained. The electrical capacity considered as a capacitor is inversely proportional to the thickness of the dielectric layer. Therefore, the thinner the thickness of the dielectric layer, the larger the electrical capacity, and the greater the storage quantity. However, if the thickness of the dielectric layer is less than 3.0 $\mu$m, nodular treatment for securing adhesion with the dielectric layer becomes unavoidable as in electrodeposited copper foils, the breakdown voltage of the manufactured double-sided copper-clad laminate for forming a capacitor layer lowers to the level similar to conventional products. On the other hand, if the thickness of the dielectric layer is 10.0 $\mu$m or more, a high breakdown voltage of the manufactured double-sided copper-clad laminate for forming a capacitor layer can be obtained even by a conventional ordinary electrodeposited copper foil, and the use of the present invention becomes meaningless.

Using the matte side of the above-described first electrodeposited copper foil, the first electrodeposited copper foils CF1 are adhered on the both sides of the dielectric layer 2 to form the double-sided copper-clad laminate for forming a capacitor layer 1a shown in the schematic sectional view of FIG. 1. Since the probability of short-circuiting between electrodeposited copper foil layers on the both sides when the breakdown voltage is measured is dramatically decreased, the production yield of the double-sided copper-clad laminates for forming capacitor layers can be improved to 70% or more.

Next, the "second double-sided copper-clad laminate" differs from the first double-sided copper-clad laminate, and is a double-sided copper-clad laminate for forming a capacitor layer using the shiny side of an untreated electrodeposited copper foil physically polished and subjected to nodular treatment and the like. In the case of an electrodeposited copper foil, the shiny side of an untreated electrodeposited copper foil has metallic luster as a mirror surface, and cannot be considered to have defects such as fine protrusions as long as visually observed. In reality, however, the shiny side of an untreated electrodeposited copper foil is affected by the surface shape of the rotating cathode, and if the surface of the rotating cathode is roughened after continuous electrolysis for a long time, or if the surface of the rotating cathode has invisible fine scratches from the beginning, projecting abnormal shapes may be produced on the surface of the shiny side.

If nodular treatment is carried out using burn plating in the state where projecting abnormal shapes or the like are present on the surface of the shiny side, the abnormal shapes are further amplified, and grown to larger abnormal shapes. Therefore, in the electrodeposited copper foil used in the present invention, the shiny side of an untreated electrodeposited copper foil formed by electrolysis is intentionally subjected to physical polishing to adjust the surface roughness (Rz) of 0.5 $\mu$m to 3.0 $\mu$m, and nodular treatment, passivation as required, silane-coupling-agent treatment and the like are performed on the surface (referred to as "second electrodeposited copper foil" for the ease of description). The surface roughness (Rz) of the shiny side of the untreated electrodeposited copper foil before physical polishing is 0.8 $\mu$m or less. Since the way of thinking on the surface roughness after polishing is same as in the case of the first double-sided copper-clad laminate, it will not be described to avoid redundant description.

In other words, when physical polishing is adopted to remove projections on the surface of the shiny side in the same manner as in the first double-sided copper-clad laminate, a controlled surface having optimally fine irregularities on the smooth surface after polishing can be evenly formed, and when copper microparticles are adhered on the surface under burn-plating conditions, the fine irregularities on the smooth surface become the current-concentrating locations, i.e., the depositing sites of copper microparticles, and even deposition on a surface occurs easily. As a result, the uniformity of the surface after nodular treatment is dramatically improved.

Using the matte side of the above-described first electrodeposited copper foil, the second electrodeposited copper foils CF2 are adhered on the both sides of the dielectric layer 2 to form the double-sided copper-clad laminate for forming a capacitor layer 1b shown in the schematic sectional view of FIG. 2. Since the probability of short-circuiting between electrodeposited copper foil layers on the both sides when the breakdown voltage is measured is dramatically decreased, the production yield of the double-sided copper-clad laminates for forming capacitor layers can be improved to 70% or more. Since the concept of the dielectric layer is same as in the case of the first double-sided copper-clad laminate, it will not be described to avoid redundant description.

<Method for Manufacturing a Double-sided Copper-clad Laminate for Forming a Capacitor Layer>

It is preferable that the double-sided copper-clad laminate for forming a capacitor layer according to the present invention is manufactured using the manufacturing methods A, B, and C described below.

Manufacturing method A: The manufacturing method A is a method for manufacturing the double-sided copper-clad laminate for forming a capacitor layer, wherein two electrodeposited copper foils each having a matte side are obtained by physically polishing, such as buffing and blasting, one side of an untreated electrodeposited copper foil obtained by an electrolysis method is adjusted to have a surface roughness (Rz) of 0.5 $\mu$m to 3.0 $\mu$m, and nodular treatment, and as required, passivation, silane coupling agent treatment, or the like are performed thereon; two electrodeposited copper foils each provided with a resin layer are obtained by forming a semi-cured resin layer of an optional thickness composing a dielectric layer on the respective matte surfaces of the two electrodeposited copper foils; and the surfaces of the resin layers of the two electrodeposited copper foils having resin layers facing to each other are adhered to form a double-sided copper-clad laminate. The manufacturing process of the manufacturing method A is conceptually shown in FIGS. 3 and 4. Therefore, the manufacturing method A will be described referring to very schematically shown in FIGS. 3 and 4.

As the manufacturing method A is described as "one side of an untreated electrodeposited copper foil obtained by an electrolysis method", the manufacturing method A is directed to both matte side and shiny side of the untreated electrodeposited copper foil. However, for the ease of understanding the description, a method directed to the matte side 4 of an untreated electrodeposited copper foil 3 is shown in FIGS. 3 and 4. In FIG. 3, a flow to manufacture an electrodeposited copper foil CF1 from an untreated electrodeposited copper foil 3, and to process the copper foil CF1 into a resin-coated electrodeposited copper foil 9a is shown. Specifically, the matte side 4 of the untreated electrodeposited copper foil 3 shown in FIG. 3(a) is physically polished to form an adjusted surface 5 on one side of the untreated electrodeposited copper foil 3 as FIG. 3(b) shows. Then, as FIG. 3(c) shows, copper microparticles 6 are deposited on the surface of the adjusted surface 5, and surface treatment such as required passivation (not shown) to form the electrodeposited copper foil CF1 provided with a nodular surface 7.

As physical polishing, either blasting or buffing is most preferable in this stage. Buffing is preferably used for making surface roughness (Rz) within a range between 1 $\mu$m and 2 $\mu$m by changing the type of buffs to control the polishing level of the adjusted surface. As blasting, wet blasting wherein media are dispersed in a solvent, and collide the media to the surface is preferably used for controlling the surface roughness (Rz) of the adjusted surface within a range between 0.5 $\mu$m and 3 $\mu$m by changing the shape and size of the blast media.

Then, as FIG. 3(d) shows, a semi-cured resin layer 8 constituting a dielectric layer 2 is formed on the nodular surface 7. To form the semi-cured resin layer 8, methods for applying a resin composition to the nodular surface 7, or for laminating resin sheets can be used, and the methods are not specifically limited. Thus, the resin-coated electrodeposited copper foil 9a is formed. The thickness of the resin layer at this time is optionally determined to be 10 $\mu$m or less after adhering described below, considering the resin flow due to the pressure of pressing.

Next, as FIG. 4(a) shows, the resin layer surfaces of two resin-coated electrodeposited copper foils 9a facing to each other are adhered to form a double-sided copper-clad laminate 1a as shown in FIG. 4(b). Therefore, in the manufacturing method A, two resin layers are adhered and integrated to form the dielectric layer 2. As described above, it is preferable to use a resin-coated electrodeposited copper foil on which a semi-cured resin layer of an optional thickness constituting the dielectric layer is formed on one side of each of two electrodeposited copper foils, from the point of view to secure the thickness precision when the thickness of the dielectric layer is as thin as 10 μm or less.

Manufacturing method B: The manufacturing method B is a method for manufacturing the double-sided copper-clad laminate for forming a capacitor layer according to any of claims 1 to 4, wherein two electrodeposited copper foils each having a matte side are obtained by physically polishing, such as buffing and blasting, one side of an untreated electrodeposited copper foil obtained by an electrolysis method to a surface roughness (Rz) of 0.5 μm to 3.0 μm, and nodular treatment, and as required, passivation, silane coupling agent treatment, or the like are performed thereon; two electrodeposited copper foils each provided with a resin layer are obtained by forming a semi-cured resin layer of an optional thickness composing a dielectric layer on the respective matte surfaces of the two electrodeposited copper foils; and the surfaces of the resin layers of the two electrodeposited copper foils having resin layers are allowed to face to each other, a heat resistant film is inserted between the surfaces, and are adhered together to form a double-sided copper-clad laminate. The manufacturing process of the manufacturing method B is conceptually shown in FIG. 5. Therefore, the manufacturing method B will be described referring to very schematically shown in FIG. 5. As the manufacturing method B is also described as "one side of an untreated electrodeposited copper foil obtained by an electrolysis method", the manufacturing method B is directed to both matte side and shiny side of the untreated electrodeposited copper foil. However, for the ease of understanding the description, the case where an electrodeposited copper foil CF1 produced by physically polishing the matte face of an untreated electrodeposited copper foil is used is shown as an example in FIG. 5.

In FIG. 3, the flow to manufacture an electrodeposited copper foil from an untreated electrodeposited copper foil, and to process the copper foil into a resin-coated electrodeposited copper foil is the same as the flow shown in FIG. 3. Specifically, the matte side 4 of the untreated electrodeposited copper foil 3 shown in FIG. 3(a) is physically polished to form an adjusted surface 5 on one side of the untreated electrodeposited copper foil 3 as FIG. 3(b) shows. Then, as FIG. 3(c) shows, copper microparticles 6 are deposited on the surface of the adjusted surface 5, and surface treatment such as required passivation (not shown) to form a nodular surface 7.

Since methods for physical polishing, and processing into the resin-coated electrodeposited copper foil 9a are same as described above, the description thereof will be omitted here.

Next, as FIG. 5(a) shows, the resin layers of two resin-coated electrodeposited copper foils 9a are allowed to face to each other, a heat-resistant film F is inserted between them, and these are adhered together to form a double-sided copper-clad laminate 1c shown in FIG. 5(b). In the dielectric layer 2 formed by the manufacturing method B, three layers (resin layer 8/heat-resistant film layer F/resin layer 8) are adhered together and integrated. Therefore, the thickness is designed so that the total thickness of the two resin layers and the heat-resistant film layer becomes 10 μm or less after adhering.

An adhesion improving treatment can be carried out on the surface of the heat-resistant film F used here. The "adhesion improving treatment" is a kind of nodular treatment for improving adhesion strength previously carried out on the both sides of the heat-resistant film layer using chemical and physical methods in order to improve adhesion with the thermosetting resin layer to avoid delamination. Specifically, the surface of the heat-resistant film layer is subjected to a physical method nodular treatment using a physical method such as plasma treatment, corona discharge treatment, or sand blast treatment; or chemical treatment such as acid treatment or alkali treatment. By the nodular treatment of the surface of the heat-resistant film, the interfacial contact area with the resin layer is enlarged, and the adhesion stability is improved.

Manufacturing method C: The manufacturing method C is a method for manufacturing the double-sided copper-clad laminate for forming a capacitor layer, wherein two electrodeposited copper foils each having a matte side are obtained by physically polishing, such as buffing and blasting, one side of an untreated electrodeposited copper foil obtained by an electrolysis method to a surface roughness (Rz) of 0.5 μm to 3.0 μm, and nodular treatment, and as required, passivation, silane coupling agent treatment, or the like are performed thereon; an electrodeposited copper foil having a resin layer is formed by forming a semi-cured resin layer of an optional thickness composing a dielectric layer on the matte surface of the electrodeposited copper foil; and the matte side of the other electrodeposited copper foil to face the resin layer of the electrodeposited copper foil, the two copper foils are laminated, and hot-pressed to form a double-sided copper-clad laminate. In order to conceptually illustrate the manufacturing process of the manufacturing method C, FIGS. 3 and 6 are used.

In the manufacturing method C, as the manufacturing method A is also described as "one side of an untreated electrodeposited copper foil obtained by an electrolysis method", the manufacturing method C is directed to both matte side and shiny side of the untreated electrodeposited copper foil. However, for the ease of understanding the description, a method directed to the matte side of an untreated electrodeposited copper foil 3 is shown in FIGS. 3 and 6. The manufacturing method C is common to the manufacturing method A up to the manufacture of two electrodeposited copper foils according to the flow shown in FIG. 3. However, in the manufacturing method C, only one electrodeposited copper foil is processed into a resin-coated electrodeposited copper foil 9b, and the other electrodeposited copper foil is used without processing. Since the physical polishing of the matte side 4 of the untreated electrodeposited copper foil 3 shown in FIG. 3(a), the formation of the adjusted surface 5 of the untreated electrodeposited copper foil 3 shown in FIG. 3(b), and surface treatment such as nodular treatment shown in FIG. 3(c) and passivation (not shown in FIG. 3) are same as described above, detailed description will be omitted.

The thickness of the semi-cured resin layer 8 shown in FIG. 3(d) of the resin-coated electrodeposited copper foil 9b used in the manufacturing method C is optionally determined to be 10 μm or less after adhering described below, considering the resin flow due to the pressure of pressing. However, the thickness of the resin-coated electrodeposited copper foil used in the manufacturing method C is necessarily thicker than the thickness in the manufacturing methods A and B.

Next, as FIG. 6(a) shows, the resin layer 8 of the resin-coated electrodeposited copper foil 9a is allowed to face to the nodular surface of the other electrodeposited copper foil CF1 and laminated, and these are hot-pressed to form a double-sided copper-clad laminate 1a shown in FIG. 6(b). Therefore, the dielectric layer 2 formed by the manufacturing method C is a single resin layer. As described above, the use of a resin-coated electrodeposited copper foil having a previously formed semi-cured resin layer of an optional thickness constituting the dielectric layer on one side of an electrodeposited copper foil is preferable from the point of view to control the thickness precision in the case where the thickness of the dielectric layer is as thin as 10 µm or less.

In the above-described manufacturing methods, the so-called badge method, or the continuous laminate method may be used. However, considering productivity, it is considered that the use of the continuous laminate method is desired. In this method, for example, two resin-coated copper foil rolls equipped with semi-cured thermosetting resin layer, and a heat-resistant film roll are used to laminate a resin-coated copper foil and a heat-resistant film discharged from the respective rolls, the laminated resin-coated copper foil and heat-resistant film are preliminarily adhered using a hot-press roll and finally cured in the curing zone to form a laminate, and the cured laminate is cut to a predetermined length.

<Printed Wiring Board Obtained Using Double-sided Copper-clad Laminate>

The double-sided copper-clad laminate for forming a capacitor layer according to the present invention has the quality that excels in the thickness precision of the dielectric layer by the use of the above-described manufacturing methods. In addition, the use of the above-described electrodeposited copper foil for constituting the double-sided copper-clad laminate for forming a capacitor layer according to the present invention can significantly improve the breakdown voltage quality, and as a result, the product yield can be dramatically improved. Therefore, the use of the double-sided copper-clad laminate for forming a capacitor layer according to the present invention enables the supply of high-quality products at low costs.

DETAILED DESCRIPTION OF THE PREFERRED EMBODIMENTS

The present invention will be described below in further details referring to the embodiments of the invention. In the embodiments, the results of manufacturing a printed wiring board used for forming a capacitor layer by manufacturing and etching a double-sided copper-clad laminate for forming a capacitor layer will be described.

Figure 1:
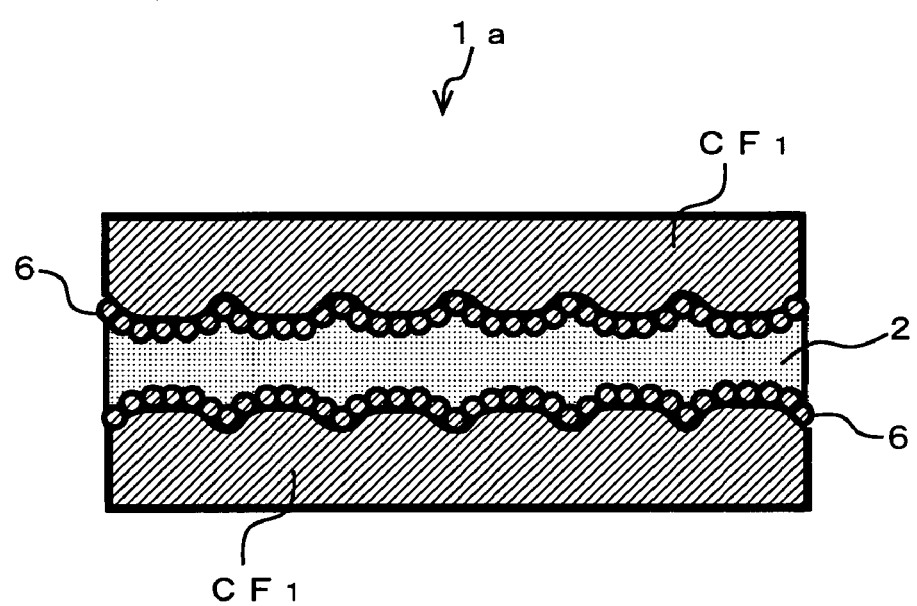
FIG. 1 is a schematic sectional view of a double-sided copper-clad laminate for forming capacitor layer.
Figure 2:
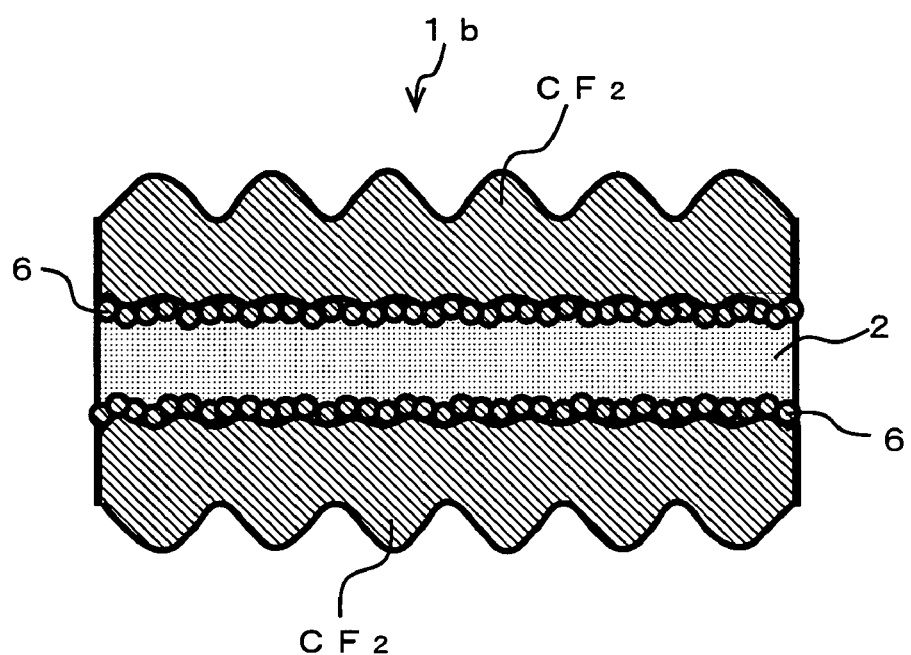
FIG. 2 is a schematic sectional view of a double-sided copper-clad laminate for forming capacitor layer.
Figure 3:
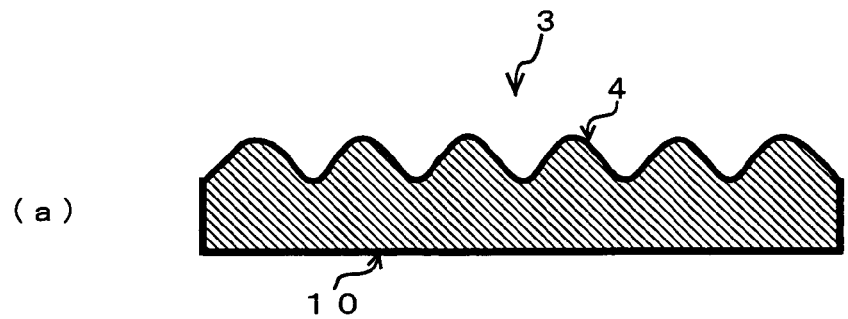
FIG. 3 is a flow diagram for manufacturing an electrodeposited copper foil with a resin layer from an untreated electrodeposited copper foil.
Figure 3:
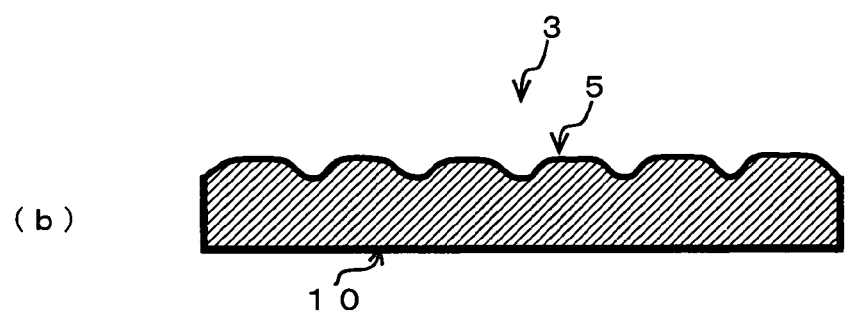
Figure 3:
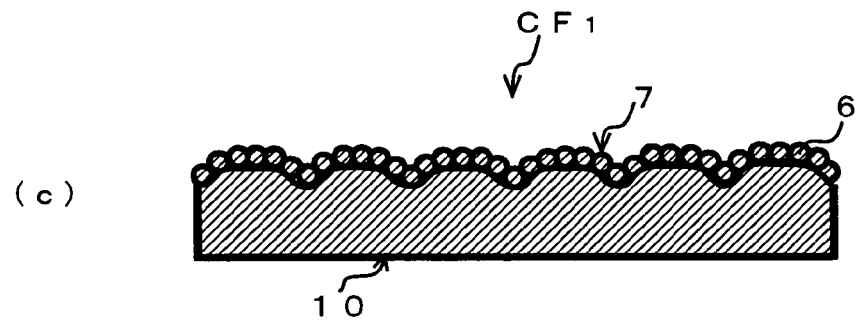
Figure 3:
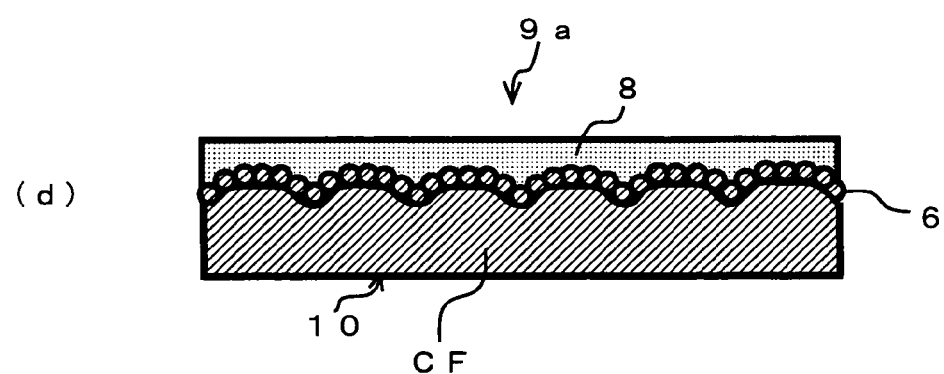
Figure 4:
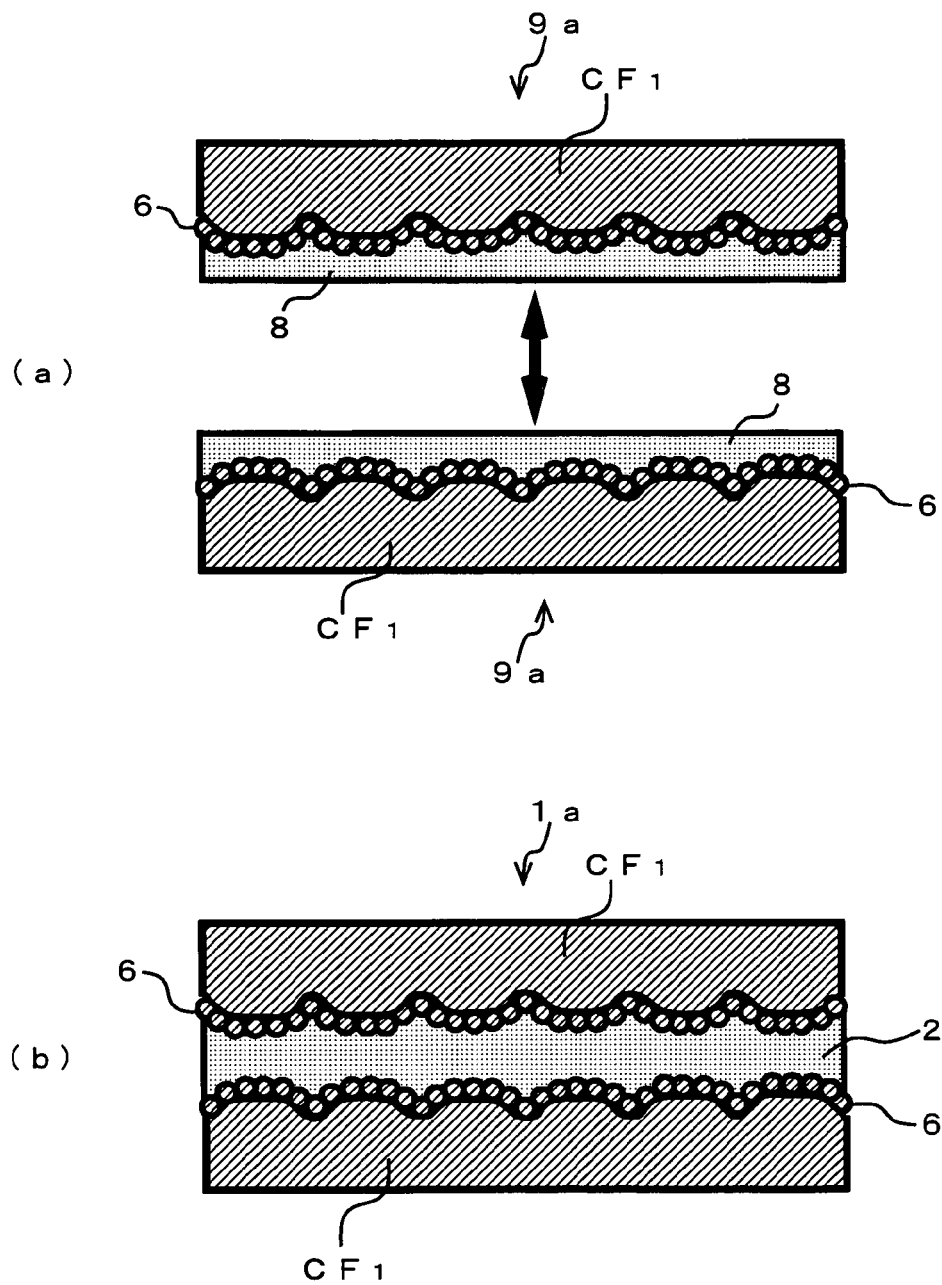
FIG. 4 is a diagram showing a method for manufacturing a double-sided copper-clad laminate for forming capacitor layer using an electrodeposited copper foil with a resin layer.

First Embodiment:

In this embodiment, the matte side of an untreated electrodeposited copper foil was physically polished to produce an electrodeposited copper foil and a resin-coated copper foil as shown in FIG. 3, and double-sided copper-clad laminate was manufactured as shown in FIG. 4.

<Manufacture of Electrodeposited Copper Foil>

First, the manufacture of an untreated electrodeposited copper foil will be briefly described. The untreated electrodeposited copper foil was manufactured using an ordinary known method by flowing a copper sulfate solution between a drum-shaped rotating cathode and a DSA anode facing along the shape of the rotating cathode to allow copper to deposit on the surface of the rotating cathode employing an electrolytic reaction; and continuously peeling the deposited copper off the rotating cathode as a foil.

The surface of the untreated electrodeposited copper foil peeled off the state contacting the rotating cathode was the shiny side transferred from the surface shape of the mirror-polished rotating cathode; and the surface of the deposition side of the untreated electrodeposited copper foil was a matte side having an irregular shape with conical protrusions because each crystal face of deposited copper had different crystal growth speed.

Next, in accordance with the flow shown in FIG. 3, the matte side 4 of the untreated electrodeposited copper foil 3 was physically polished to form an adjusted surface 5, and nodular treatment and passivation were carried out on the adjusted surface 5 in the surface treatment step. A buffing method is used for the physical polishing of the matte side of the untreated electrodeposited copper foil, and using a #2000 buff roll, the matte side of the untreated electrodeposited copper foil running on the roll was tangentially polished to form an adjusted surface of the surface state of Rz=1.8 µm.

The untreated electrodeposited copper foil 3 after physical polishing was first undergone a cleaning treatment using a diluted sulfuric acid solution of a concentration of 150 g/l and a liquid temperature of 30° C. to remove adhered fatty components.

After cleaning, as FIG. 3(c) shows, copper microparticles 6 were deposited on the adjusted surface 5 in the depositing step, and seal plating was performed for preventing the copper microparticles from dropping off.

In the step for depositing copper microparticles on the adjusted surface 5, electrolysis was performed for 10 seconds using a copper sulfate solution of a sulfuric acid content of 100 g/l and a copper content of 18 g/l, and a stainless-steel counter electrode, under the conditions of a liquid temperature of 25° C. and a current density of 10 A/dm$^2$.

In the seal-plating step for preventing the copper microparticles from dropping off, electrolysis was performed for 20 seconds using a copper sulfate solution of a sulfuric acid content of 150 g/l and a copper content of 65 g/l, and a stainless-steel counter electrode, under the conditions of a liquid temperature of 45° C. and a current density of 15 A/dm².

Passivation was performed using zinc as the rust-prevention metal. Here, a dissolving anode using zinc as the anode was used to maintain the zinc content balance in the rust-prevention vessel, and zinc plating was performed on both the matte side and the opposite side by electrolysis for 10 seconds, using a zinc sulfate bath of a sulfuric acid content of 70 g/l and a zinc content of 20 g/l under conditions of a liquid temperature of 40° C. and a current density of 15 A/dm².

After passivation, a silane coupling agent was showered onto the matte surface, and the foil was passed through the furnace of an ambient temperature heated to 110° C. using an electric heater in 40 seconds to obtain an electrodeposited copper foil CF1 of a thickness of 35 µm. The foil was cleaned using means to enable sufficient water cleaning installed between the above-described steps as required, to prevent the solution of the preceding steps from being carried in.

<Manufacture of Resin-coated Copper Foil>

A resin-coated copper foil 9a manufactured using the electrodeposited copper foil CF1 obtained by the above-described method will be described.

The resin composition used for forming the resin layer 8 shown in FIG. 3(d) will be described. Here, 30 parts by weight of a bisphenol A type phenoxy resin (YP-50 manufactured by Tohto Kasei Co., Ltd.), 30 parts by weight of a bisphenol A type epoxy resin (Epikote 828 manufactured by Japan Epoxy Resins Co., Ltd.), 40 parts by weight of a cresol novolak type epoxy resin (YDCN704 manufactured by Tohto Kasei Co., Ltd.), 2.5 parts by weight of dicyandiamide as the curing agent, and 0.1 part by weight of 2-ethyl-4-methylimidazole were dissolved in a solvent (DMF) to obtain a thermosetting resin.

The thermosetting resin prepared as described above was applied onto the matte side 7 of the electrodeposited copper foil CF1 of a thickness of 35 µm, dried for 3 minutes at 130° C. to obtain two resin-coated electrodeposited copper foils 9a each having a thermosetting resin layer of a dried thickness in the so-called B-stage (semi-cured) state of 5 µm.

<Manufacture of Double-sided Copper-clad Laminate>

As FIG. 4(a) shows, the resin layers of two resin-coated electrodeposited copper foils 9a were allowed to face to each other and laminated, and pressed for 60 minutes at 165° C. in an ordinary vacuum hot press to obtain a double-sided copper-clad laminate of a 30-cm square for forming a capacitor layer as shown in FIG. 4(b).

Ten double-sided copper-clad laminates 1a were manufactured by the method as described above, and undergone a breakdown voltage test for 30 seconds at 500 V DC in accordance with Paragraph 2.5.7 of the IPC-TM-650 Standards. As a result, no conduction phenomenon occurred in the 10 samples, and the test could be conducted smoothly. The average capacitance at this time was 0.31 nF/cm², and the average thickness of the dielectric layer 2 measured by the cross section observation from the cut surfaces was 9.5 µm.

Figure 7:
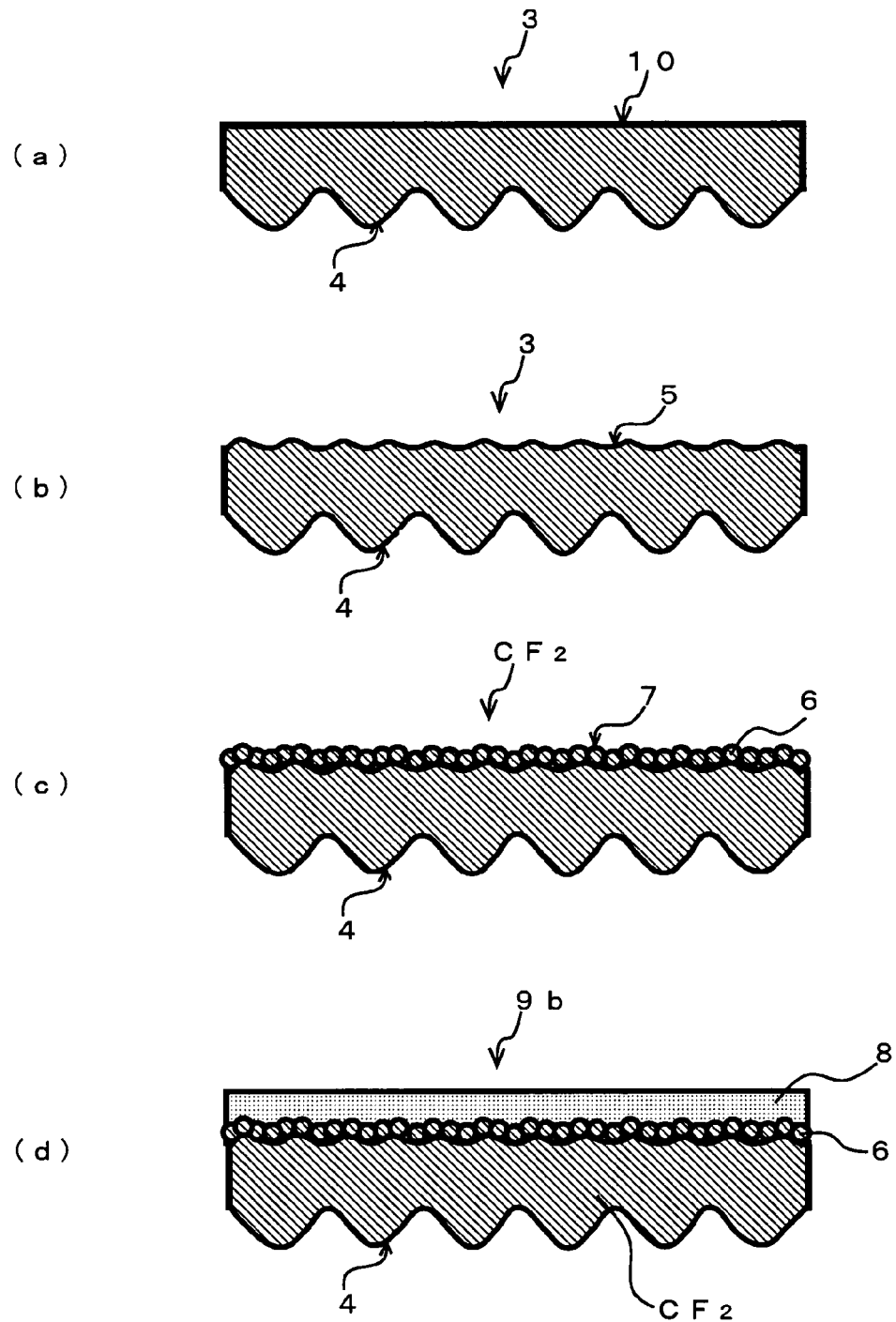
FIG. 7 is a flow diagram for manufacturing an electrodeposited copper foil with a resin layer from an untreated electrodeposited copper foil.
Figure 8:
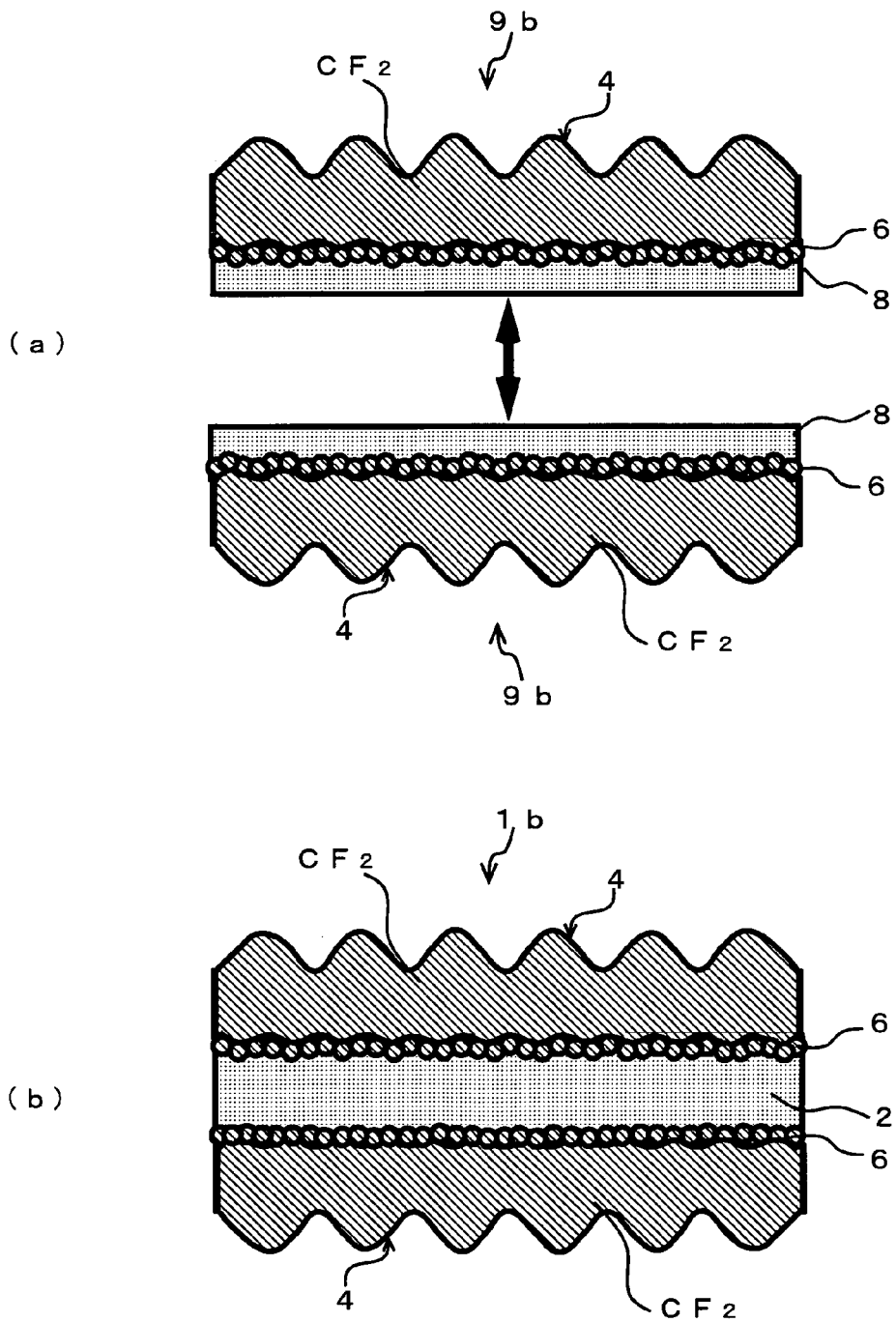
FIG. 8 is a diagram showing a method for manufacturing a double-sided copper-clad laminate for forming capacitor layer using an electrodeposited copper foil with a resin layer.
Figure 9:
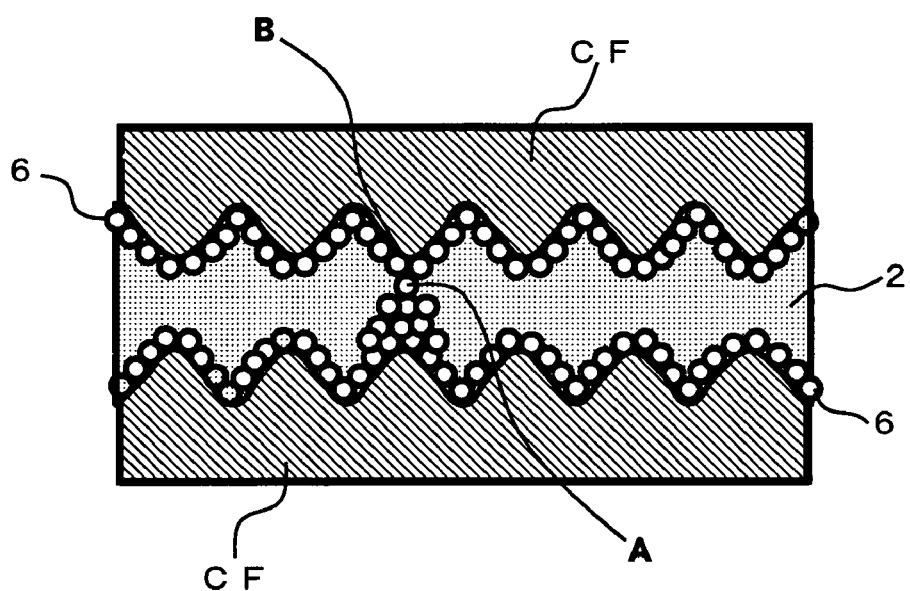
FIG. 9 is a schematic sectional view of a double-sided copper-clad laminate for forming capacitor layer for illustrating a conduction phenomenon.

Second Embodiment:

In this embodiment, the shiny side 10 of an untreated electrodeposited copper foil was physically polished following the flow shown in FIG. 7, and a double-sided copper-clad laminate was manufactured as shown in FIG. 8. Therefore, the manufacturing conditions were same as in the first embodiment except that only the side to be physically polished is different. Therefore, the description of the like portions will be omitted to avoid redundant description.

<Manufacture of Electrodeposited Copper Foil>

Since an untreated electrodeposited copper foil same as the untreated electrodeposited copper foil used in the first embodiment was used, the detailed description of the like portions will be omitted to avoid redundant description.

In accordance with the flow shown in FIG. 7, the shiny side 10 of the untreated electrodeposited copper foil 3 was physically polished to form an adjusted surface 5, and nodular treatment and passivation were carried out on the adjusted surface 5 in the surface treatment step. A buffing method is used for the physical polishing of the shiny side 10 of the untreated electrodeposited copper foil 3, and using a #2000 buff roll, the shiny side of the untreated electrodeposited copper foil running on the roll was tangentially polished to form an adjusted surface of the surface state of Rz=1.3 µm.

Then, after physical polishing, the untreated electrodeposited copper foil 3 was subjected to cleaning treatment in the same manner as in the first embodiment, copper microparticles 6 were deposited on the adjusted surface 5 in the depositing step, and seal plating for preventing the copper microparticles from dropping off, zinc passivation, and silane coupling agent treatment were preformed and the foil was dried to form an electrodeposited copper foil CF2.

<Manufacture of Resin-coated Copper Foil>

A method for manufacturing the resin-coated copper foil 9b shown in FIG. 7(d) using the electrodeposited copper foil CF2 obtained by the above-described method will be described. The resin composition used for forming the resin layer 8, and obtaining two resin-coated copper foils 9b each having a thermosetting resin layer of a dried thickness in the so-called B-stage (semi-cured) state of 5 µm are same as in the first embodiment. Therefore, the detailed description of the like portions will be omitted to avoid redundant description.

<Manufacture of Double-sided Copper-clad Laminate>

As FIG. 8(a) shows, the resin layers of two resin-coated electrodeposited copper foils 9b were allowed to face to each other and laminated, and pressed under the same conditions as in the first embodiment to obtain a double-sided copper-clad laminate 1b of a 30-cm square for forming a capacitor layer as shown in FIG. 8(b).

Ten double-sided copper-clad laminates 1b were manufactured by the method as described above, and undergone a breakdown voltage test for 30 seconds at 500 V DC in accordance with Paragraph 2.5.7 of the IPC-TM-650 Standards. As a result, no conduction phenomenon occurred in the 10 samples, and the test could be conducted smoothly. The average capacitance at this time was 0.32 nF/cm², and the average thickness of the dielectric layer 2 measured by the cross section observation from the cut surfaces was 9.8 µm.

Figure 5:
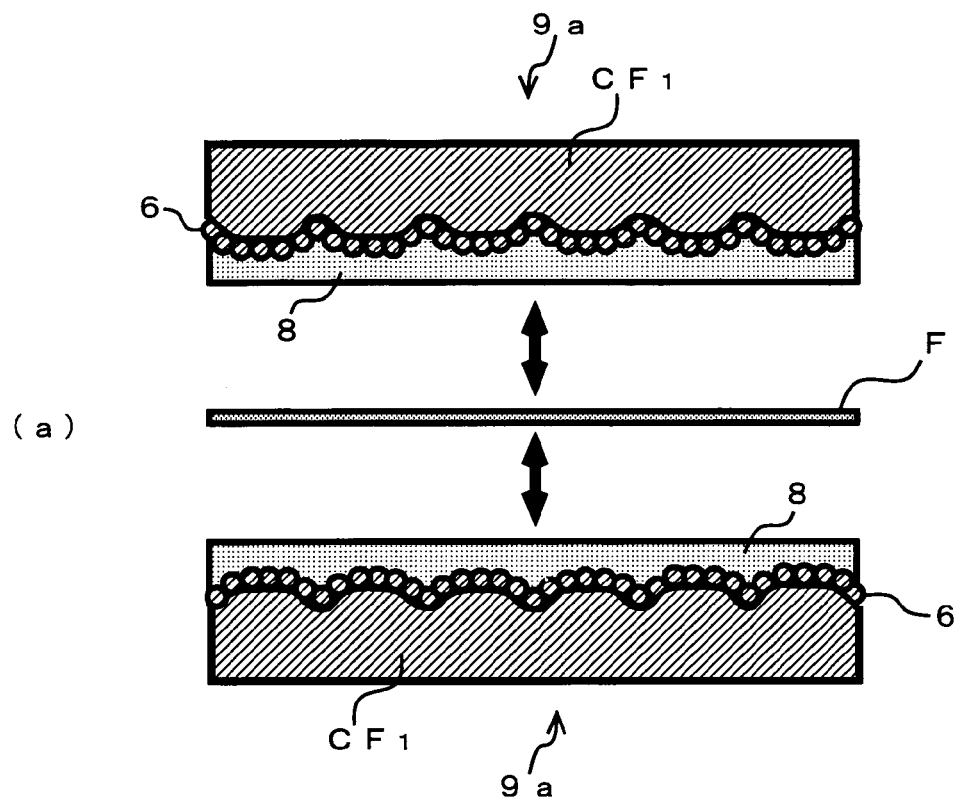
FIG. 5 is a diagram showing a method for manufacturing a double-sided copper-clad laminate for forming capacitor layer using an electrodeposited copper foil with a resin layer.
Figure 5:
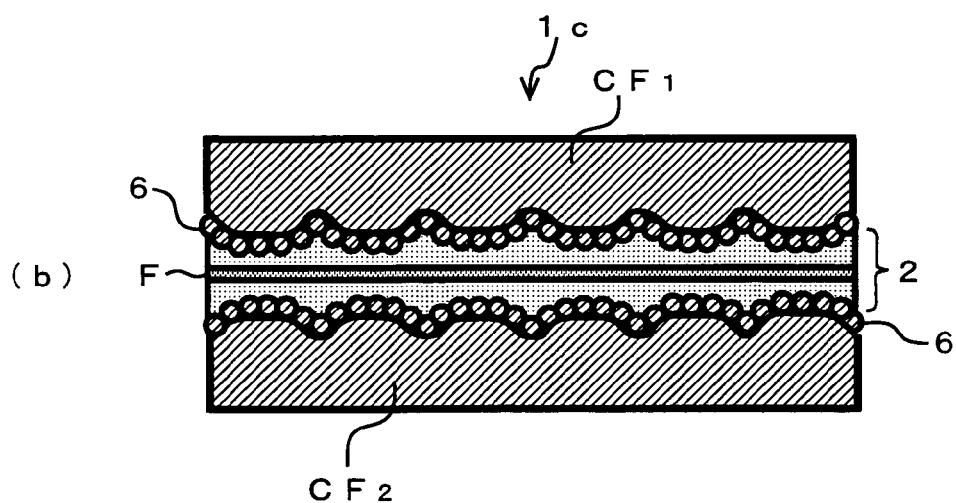
Figure 6:
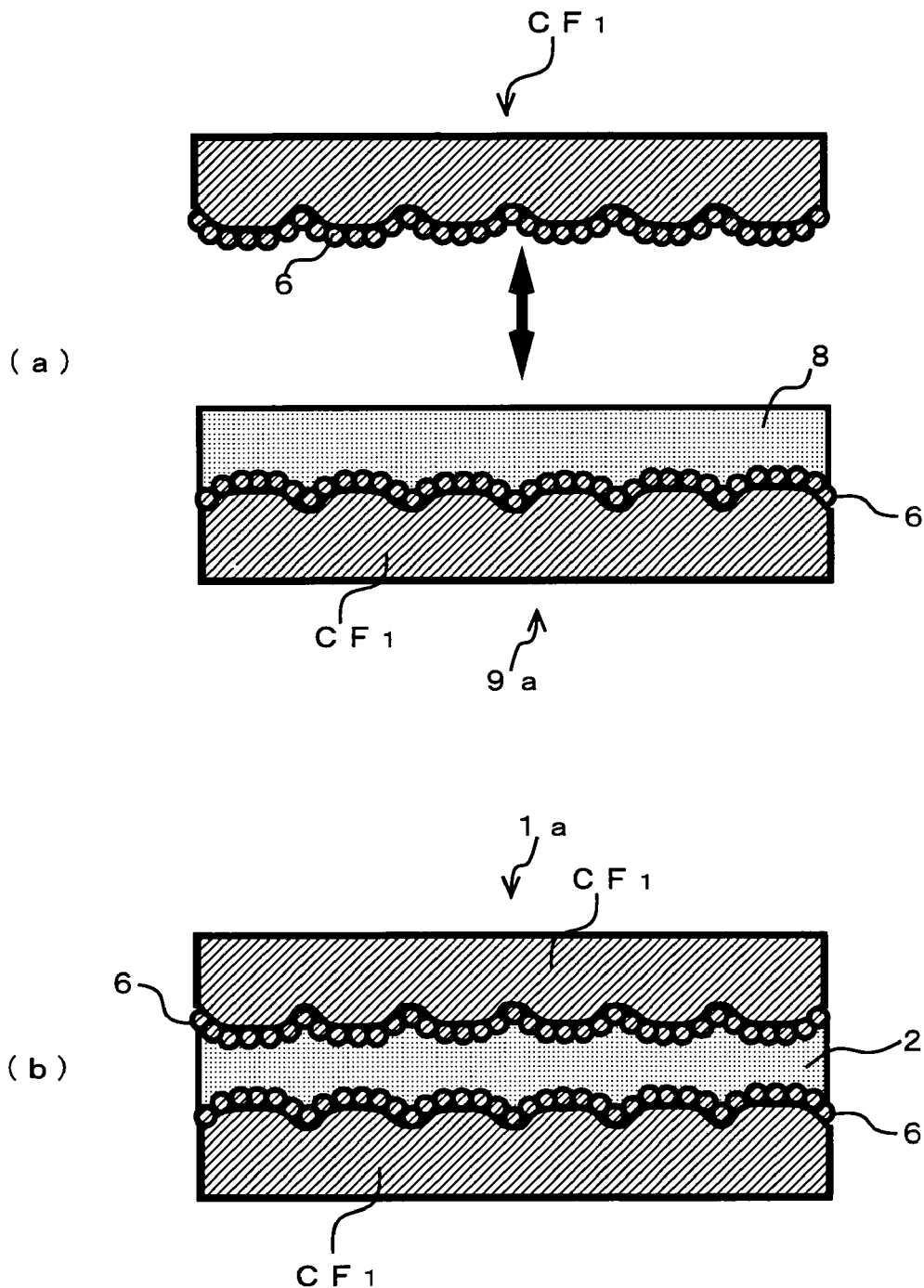
FIG. 6 is a diagram showing a method for manufacturing a double-sided copper-clad laminate for forming capacitor layer using an electrodeposited copper foil with a resin layer.

Third Embodiment:

In this embodiment, using resin-coated copper foils 1a manufactured in accordant to the flow shown in FIG. 3 as in the first embodiment, a double-sided copper-clad laminate was manufactured by sandwiching a heat-resistant film as shown in FIG. 5(a). Therefore, the manufacturing conditions were same as in the first embodiment except that only the side to be physically polished is different. Therefore, the description of the like portions will be omitted to avoid redundant description.

Manufacture of Electrodeposited Copper Foil

Since an untreated electrodeposited copper foil 3 same as the copper foil used in the first embodiment was physically polished and cleaned, copper microparticles 6 are deposited on the adjusted surface 5, and the foil was undergone zinc rust-prevention treatment, silane coupling agent treatment, and dried to form an electrodeposited copper foil CF1 in the same manner as in the first embodiment; detailed description will be omitted here to avoid redundant description.

Manufacture of Resin-coated Copper Foil

A method for manufacturing the resin-coated copper foil 9a using the electrodeposited copper foil CF1 obtained by the above-described method will be described. The only difference is that the resin is applied to the nodular surface to form a thermosetting resin layer of a dried thickness in the so-called B-stage (semi-cured) state of 3 $\mu$m. The resin composition and drying conditions for forming the resin layer 8, and obtaining two resin-coated electrodeposited copper foils are same as in the first embodiment. Therefore, the detailed description of the like portions will be omitted to avoid redundant description.

Manufacture of Double-sided Copper-clad Laminate

As FIG. 5(a) shows, a resin-coated electrodeposited copper foil 9a was placed with the resin layer face up, a heat-resistant film F was overlaid on the resin layer, a resin-coated electrodeposited copper foil 9a was placed on the heat-resistant film F with the resin layer face down, and these were pressed for 60 minutes at 165° C. using an ordinary vacuum hot press to obtain a double-sided copper-clad laminate 1c of a 30-cm square for forming a capacitor layer as shown in FIG. 5(b).

The dielectric film used at this time is an aromatic polyamide film (manufactured by Asahi Kasei Corporation, trade name: Aramica) of a thickness of 4 $\mu$m and a specific inductive capacity of 4.0, the both sides of which is nodular-treated by corona discharge to improve adhesiveness.

Ten double-sided copper-clad laminates 1c were manufactured by the method as described above, and undergone a breakdown voltage test for 30 seconds at 500 V DC in accordance with Paragraph 2.5.7 of the IPC-TM-650 Standards. As a result, no conduction phenomenon occurred in the 10 samples, and the test could be conducted smoothly. The average capacitance at this time was 0.31 nF/cm$^2$, and the average thickness of the dielectric layer (total thickness of resin layer/heat-resistant film layer/resin layer) measured by the cross section observation from the cut surfaces was 9.9 $\mu$m.

Furthermore, in the double-sided copper-clad laminates 1c, although dry films were adhered on the both sides, the capacitor circuit pattern was exposed, developed and etched using an etching apparatus, the dielectric layer 2 was not broken.

COMPARATIVE EXAMPLE 1

In this comparative example, the physical polishing of the matte side of the untreated electrodeposited copper foil was omitted in the flow shown in FIG. 3, an ordinary electrodeposited copper foil and a resin-coated copper foil were manufactured, and a double-sided copper-clad laminate was manufactured in the same manner as shown in FIG. 4. Therefore, the only difference is the absence of the physical polishing of the untreated electrodeposited copper foil, and other manufacturing conditions are same as in the first embodiment. Therefore, the description of like portions will be omitted to avoid redundant description.

Manufacture of Electrodeposited Copper Foil

Since an untreated electrodeposited copper foil same as in the first embodiment was used, the detailed description of portions having the same functions will be omitted to avoid redundant description. It is clarified for confirmation that the untreated electrodeposited copper foil used in this comparative example was used as the electrodeposited copper foil without physical polishing for adjusting the surface.

The matte side of the untreated electrodeposited copper foil without physical polishing has a surface roughness of Rz=5.0 $\mu$m, cleaning treatment is performed in the same manner as in the first embodiment, copper microparticles are deposited on the matte side, and zinc passivation, silane coupling agents treatment, and drying are performed to manufacture an electrodeposited copper foil.

Manufacture of Resin-coated Copper Foil

A method for manufacturing the resin-coated copper foil using the electrodeposited copper foil obtained by the above-described method will be described. The resin composition used for forming the resin layer, and obtaining two resin-coated copper foils each having a thermosetting resin layer of a dried thickness in the B-stage (semi-cured) state of 5 $\mu$m are same as in the first embodiment. Therefore, the detailed description of the like portions will be omitted to avoid redundant description.

Manufacture of Double-sided Copper-clad Laminate

The resin layers of two resin-coated electrodeposited copper foils were allowed to face to each other and laminated, and pressed under the same conditions as in the first embodiment to obtain a double-sided copper-clad laminate of a 30-cm square for forming a capacitor layer.

Ten double-sided copper-clad laminates 1b were manufactured by the method as described above, and undergone a breakdown voltage test for 30 seconds at 500 V DC in accordance with Paragraph 2.5.7 of the IPC-TM-650 Standards. As a result, no conduction phenomenon occurred in the 3 samples, and the test could be conducted smoothly. However, conduction phenomenon occurred in the 7 samples, and the breakdown voltage could not be measured. The average capacitance in the measurable range at this time was 0.27 nF/cm$^2$, and the average thickness of the dielectric layer measured by the cross section observation from the cut surfaces was 8.9 $\mu$m.

COMPARATIVE EXAMPLE 2

In this comparative example, the physical polishing of the shiny side of the untreated electrodeposited copper foil was omitted in the flow shown in FIG. 7 of the second embodiment, an electrodeposited copper foil and a resin-coated copper foil were manufactured, and a double-sided copper-clad laminate was manufactured in the same manner as shown in FIG. 4. Therefore, the only difference from the second embodiment is the absence of the physical polishing of the untreated electrodeposited copper foil, and other manufacturing conditions are same as in the second embodiment. Therefore, the description of like portions will be omitted to avoid redundant description.

Manufacture of Electrodeposited Copper Foil

Since an untreated electrodeposited copper foil same as in the first embodiment was used, the detailed description of portions having the same functions will be omitted to avoid redundant description. It is clarified for confirmation that the untreated electrodeposited copper foil used in this comparative example was used as the electrodeposited copper foil without physical polishing for adjusting the surface.

The shiny side of the untreated electrodeposited copper foil without physical polishing has a surface roughness of Rz=0.7 μm, cleaning treatment is performed in the same manner as in the first embodiment, copper microparticles are deposited on the matte side, and zinc passivation, silane coupling agents treatment, and drying are performed to manufacture an electrodeposited copper foil.

<Manufacture of Resin-coated Copper Foil>

A method for manufacturing the resin-coated copper foil using the electrodeposited copper foil obtained by the above-described method will be described. The resin composition used for forming the resin layer, and obtaining two resin-coated copper foils each having a thermosetting resin layer of a dried thickness in the B-stage (semi-cured) state of 5 μm are same as in the first embodiment. Therefore, the detailed description of the like portions will be omitted to avoid overlapped description.

<Manufacture of Double-sided Copper-clad Laminate>

The resin layers of two resin-coated electrodeposited copper foils were allowed to face to each other and laminated, and pressed under the same conditions as in the first embodiment to obtain a double-sided copper-clad laminate of a 30-cm square for forming a capacitor layer.

Ten double-sided copper-clad laminates 1b were manufactured by the method as described above, and undergone a breakdown voltage test for 30 seconds at 500 V DC in accordance with Paragraph 2.5.7 of the IPC-TM-650 Standards. As a result, no conduction phenomenon occurred in the 6 samples, and the test could be conducted smoothly. However, conduction phenomenon occurred in the 4 samples, and the breakdown voltage could not be measured. The average capacitance in the measurable range at this time was 0.29 nF/cm$^2$, and the average thickness of the dielectric layer measured by the cross section observation from the cut surfaces was 9.7 μm.

As obviously understood from the comparison of each embodiment and comparative examples, very high product yield is obtained from all of the above-described embodiments compared with comparative examples.

The double-sided copper-clad laminate for forming a capacitor layer of a printed wiring board can significantly improve the breakdown voltage quality by using an electrodeposited copper foil obtained by physically polishing the surface of the above-described untreated electrodeposited copper foil; and as a result, the product yield can be dramatically improved. Therefore, the use of the double-sided copper-clad laminate for forming a capacitor layer according to the present invention in a printed wiring board enables the supply of high-quality products at low costs.

Also the use of the electrodeposited copper foil used in the present invention for the manufacture of the double-sided copper-clad laminate for forming a capacitor layer according to the present invention dramatically raises the manufacturing yield of products that excel in the thickness precision of the dielectric layer, and excel in the breakdown voltage quality; and lowers the total manufacturing costs.

What is claimed is:

1. A double-sided copper-clad laminate for forming a capacitor layer formed by adhering electrodeposited copper foils on the both sides of a dielectric layer,
   wherein said electrodeposited copper foil is provided with a matte side to be joined to the dielectric layer prepared through physically polishing a rough surface of an untreated electrodeposited copper foil obtained through an electrolysis method to a surface roughness (Rz) of 0.5 μm to 3.0 μm, and nodular treatment, and as required, passivation and silane coupling agent treatment are performed thereon.

2. The double-sided copper-clad laminate for forming a capacitor layer according to claim 1, wherein the dielectric layer contains a thermosetting resin, fine ferroelectric powder, and filler.

3. The double-sided copper-clad laminate for forming a capacitor layer according to claim 1, wherein the thickness of the dielectric layer is 3.0 μm to 10.0 μm.

4. A printed wiring board formed using the double-sided copper-clad laminate for forming a capacitor layer according to claim 1.

5. A double-sided copper-clad laminate for forming a capacitor layer formed by adhering electrodeposited copper foils on the both sides of a dielectric layer,
   wherein said electrodeposited copper foil is provided with a shiny side to be joined to the dielectric layer adjusted through physically polishing a rough surface of an untreated electrodeposited copper foil obtained by an electrolysis method to a surface roughness (Rz) of 0.5 μm to 3.0 μm, and nodular treatment, and as required, passivation and silane coupling agent treatment are performed on the surface thereof.

6. The double-sided copper-clad laminate for forming a capacitor layer according to claim 5, wherein the dielectric layer contains a thermosetting resin, fine ferroelectric powder, and filler.

7. The double-sided copper-clad laminate for forming a capacitor layer according to claim 5, wherein the thickness of the dielectric layer is 3.0 μm to 10.0 μm.

8. A printed wiring board formed using the double-sided copper-clad laminate for forming a capacitor layer according to claim 5.

* * * * *